(12) United States Patent
Chang et al.

(10) Patent No.: US 9,876,493 B2
(45) Date of Patent: Jan. 23, 2018

(54) DECODE SWITCH AND METHOD FOR CONTROLLING DECODE SWITCH

(71) Applicant: MACRONIX International Co., Ltd., Hsinchu (TW)

(72) Inventors: Yi-Fan Chang, Hsinchu (TW); Chun-Yi Lee, Hsinchu (TW); Ken-Hui Chen, Hsinchu (TW); Kuen-Long Chang, Hsinchu (TW); Chun-Hsiung Hung, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 123 days.

(21) Appl. No.: 14/693,565

(22) Filed: Apr. 22, 2015

(65) Prior Publication Data

US 2016/0204697 A1 Jul. 14, 2016

Related U.S. Application Data

(60) Provisional application No. 62/103,073, filed on Jan. 14, 2015.

(51) Int. Cl.
*G11C 8/00* (2006.01)
*H03K 17/00* (2006.01)
*G11C 8/10* (2006.01)

(52) U.S. Cl.
CPC ............ *H03K 17/007* (2013.01); *G11C 8/00* (2013.01); *G11C 8/10* (2013.01); *H03K 2217/0036* (2013.01)

(58) Field of Classification Search
CPC ....... H02M 3/10; H03K 17/30; H03K 17/007; H03K 2217/0036; H04N 19/00; H03M 13/00; G11C 8/10; G11C 8/00
See application file for complete search history.

(56) References Cited

U.S. PATENT DOCUMENTS

| | | | | |
|---|---|---|---|---|
| 7,486,557 B2 * | 2/2009 | Kim | .................. | G11C 16/10 365/185.11 |
| 7,495,992 B2 * | 2/2009 | Pan | .................. | G11C 16/08 365/185.23 |

* cited by examiner

*Primary Examiner* — Jung Kim
(74) *Attorney, Agent, or Firm* — J.C. Patents

(57) ABSTRACT

A decode switch and a method for controlling a decode switch are provided. The decode switch includes a power source providing a first voltage, a source capacitance coupled to the power source, and a target capacitance coupled to the power source. The power source charges the source capacitance to the first voltage. The source capacitance is connected to the target capacitance and the source capacitance charges the target capacitance to a second voltage. The power source charges the target capacitance from the second voltage to the first voltage.

12 Claims, 6 Drawing Sheets

DECODE SWITCH AND METHOD FOR CONTROLLING DECODE SWITCH

CROSS-REFERENCE TO RELATED APPLICATION

This application claims the priority benefits of U.S. provisional application Ser. No. 62/103,073, filed on Jan. 14, 2015. The entirety of the above-mentioned patent application is hereby incorporated by reference herein and made a part of this specification.

BACKGROUND OF THE INVENTION

Field of the Invention

The present invention relates to a decode switch. More particularly, the present invention relates to a method for controlling a decode switch.

Description of the Related Art

FIG. 1 is a schematic diagram showing a conventional decode switch 100. The decode switch 100 includes a power source 110 and n decode paths 121-12n coupled to the power source 110. n is a preset integer larger than one. Each decode path includes two switches, a capacitance, and an output terminal. For example, the decode path 121 includes two switches ENA and DISA, a capacitance CL1, and an output terminal OUTA. The decode path 122 includes two switches ENB and DISB, a capacitance CL2, and an output terminal OUTB, and so on.

The power source 110 provides the preset voltage VPP. By controlling the switches ENA-ENn and DISA-DISn, the power source 110 can charge one or more capacitances CL1-CLn of one or more decode paths 121-12n from the reference voltage VBS (the reference voltage VBS may be a ground voltage or a deselect voltage) to the preset voltage VPP. The charging of the capacitances CL1-CLn raises the voltage of the output terminals OUTA-OUTn from the VBS to the preset voltage VPP. The raising of the voltage of an output terminal is also known as asserting the output terminal.

The decode switch 100 can be used in many circuit systems, such as in address decoders of memories.

FIG. 2 is a schematic diagram showing a conventional method for controlling the decode switch 100 to switch the assertion from the output terminal OUTA to the output terminal OUTB. At the time moment T1, the switch ENA is turned on and the switch DISA is turned off, thus connecting the capacitance CL1 to the power source 110 through the switch ENA. The power source 110 asserts the output terminal OUTA by charging the capacitance CL1 of the decode path 121.

At the time moment T2, the switches DISA and ENB are turned on, while the switches ENA and DISB are turned off. The capacitance CL1 is disconnected from the power source 110 and is connected to the reference voltage VBS through the switch DISA. Consequently, the capacitance CL1 begins discharging to the VBS. At the same moment T2, the capacitance CL2 is connected to the power source 110 through the switch ENB. At the time moment T3, the power source 110 asserts the output terminal OUTB by charging the capacitance CL2 of the decode path 122. The time period Tso between the moments T2 and T3 is the setup time of the output terminal OUTB of the decode path 122.

At the time moment T4, the switch ENB is turned off and the switch DISB is turned on. The capacitance CL2 is disconnected from the power source 110 and is connected to the ground through the switch DISB. Consequently, the capacitance CL2 begins discharging to the VBS. The electric charges previously stored in the capacitances CL1 and CL2 are simply squandered to the reference voltage VBS (a ground or a deselect voltage).

FIG. 3 is a schematic diagram showing a conventional method for controlling the decode switch 100 to assert all of the output terminals OUTA-OUTn. In FIG. 3, EN_all represents the switches ENA-ENn, DIS_all represents the switches DISA-DISn and OUT_all represents all of the output terminals OUTA-OUTn. At the time moment T1, the switches ENA-ENn are turned on and the switches DISA-DISn are turned off, thus connecting all of the capacitances CL1-CLn to the power source 110. The power source 110 asserts the output terminals OUTA-OUTn by charging the capacitances CL1-CLn of the decode paths 121-12n. The setup speed of the decode paths is slow because the power source 110 needs to charge all of the capacitances CL1-CLn.

SUMMARY OF THE INVENTION

Accordingly, the present invention is directed to a decode switch and a method for controlling a decode switch. The decode switch and the method can use charge sharing to reduce power consumption and shorten setup time.

According to an embodiment of the present invention, a decode switch is provided. The decode switch includes a power source providing a first voltage, one or more source capacitance(s) coupled to the power source, and a target capacitance coupled to the power source. The power source charges the at least one source capacitance to the first voltage. The at least one source capacitance is connected to the target capacitance and the at least one source capacitance charges the target capacitance to a second voltage. The power source charges the target capacitance from the second voltage to the first voltage.

According to another embodiment of the present invention, a method for controlling a decode switch is provided. The method includes the steps of a power source of the decode switch charging at least one source capacitance of the decode switch to a first voltage, connecting the at least one source capacitance to a target capacitance of the decode switch, the at least one source capacitance charging the target capacitance to a second voltage, and the power source charging the target capacitance from the second voltage to the first voltage.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
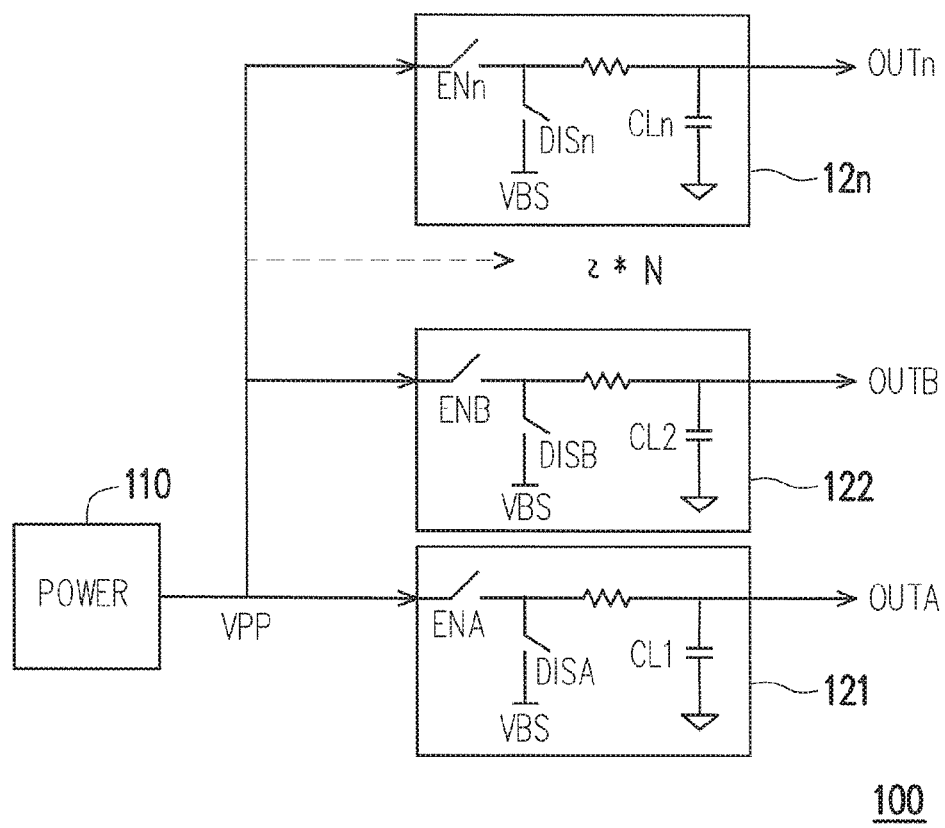
FIG. 1 is a schematic diagram showing a conventional decode switch.

Reference will now be made in detail to the present embodiments of the invention, examples of which are illustrated in the accompanying drawings. Wherever possible, the same reference numbers are used in the drawings and the description to refer to the same or like parts.

Figure 4:
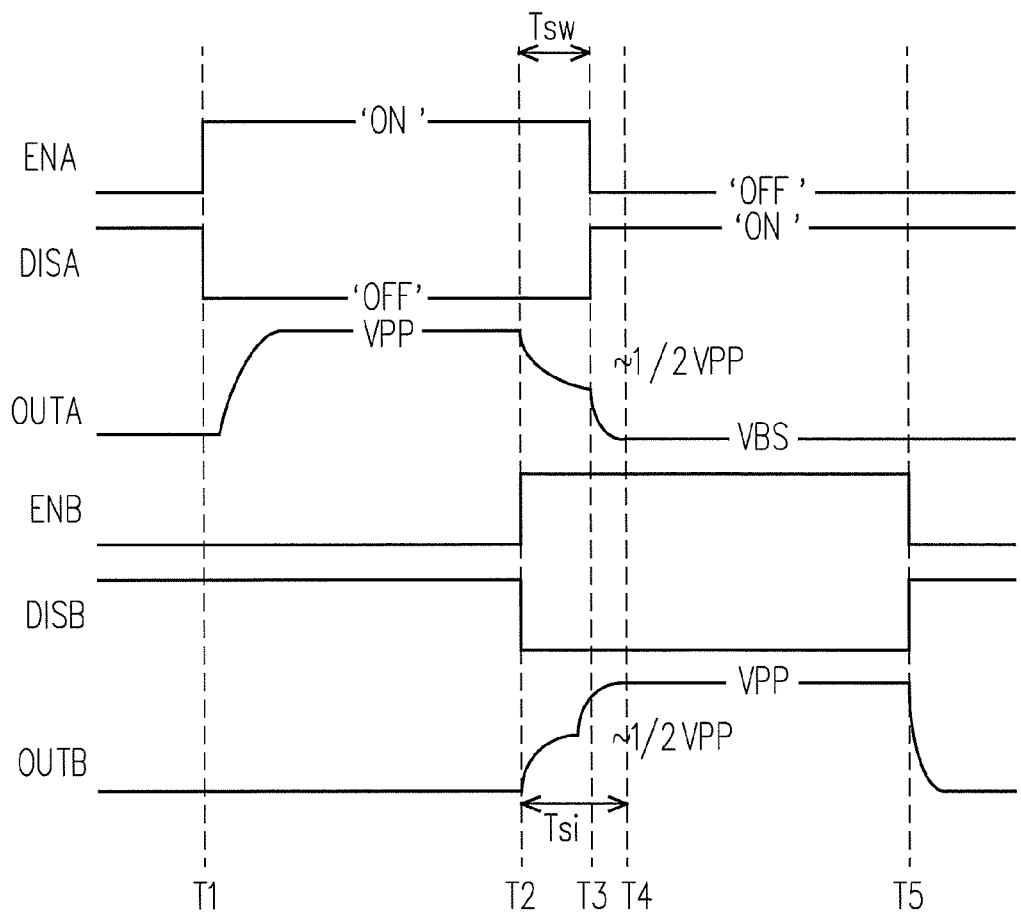
FIG. 4 is a schematic diagram showing a method for controlling a decode switch according to an embodiment of the invention.

FIG. 4 is a schematic diagram showing a method for controlling the decode switch 100 to switch the assertion from the output terminal OUTA to the output terminal OUTB according to an embodiment of the invention. At the time moment T1, the switch ENA is turned on and the switch DISA is turned off, thus connecting the capacitance CL1 to the power source 110 through the switch ENA. The power source 110 asserts the output terminal OUTA by charging the capacitance CL1 of the decode path 121 from a reference voltage VBS to a first voltage (such as the preset voltage VPP), wherein the reference voltage VBS may be a ground or a deselect voltage.

At the time moment T2, the switch ENB is turned on and the switch DISB is turned off, thus connecting the capacitances CL1 and CL2 through the switches ENA and ENB. The capacitance CL1 begins charging the capacitance CL2. Therefore, the voltage of the output terminal OUTA drops from the preset voltage VPP and the voltage of the output terminal OUTB rises from the reference voltage VBS. At the time moment T3, both the voltages of the output terminals OUTA and OUTB reach a second voltage (such as a sharing voltage), which is approximately ½ VPP.

At the same time moment T3, the switch ENA is turned off and the switch DISA is turned on. Consequently, the capacitance CL1 is disconnected from the capacitance CL2 and the capacitance CL1 is connected to the reference voltage VBS through the switch DISA. The capacitance CL1 begins discharging and the voltage of the output terminal OUTA gradually drops from the sharing voltage. On the other hand, the power source 110 charges the capacitance CL2 and the voltage of the output terminal OUTB gradually rises from the sharing voltage. At the time moment T4, the capacitance CL1 discharges to the reference voltage VBS and the capacitance CL2 is charged to the preset voltage VPP.

At the time moment T5, the switch ENB is turned off and the switch DISB is turned on. The capacitance CL2 is disconnected from the power source 110 and is connected to the ground through the switch DISB. Consequently, the capacitance CL2 begins discharging to the reference voltage VBS.

Figure 2:
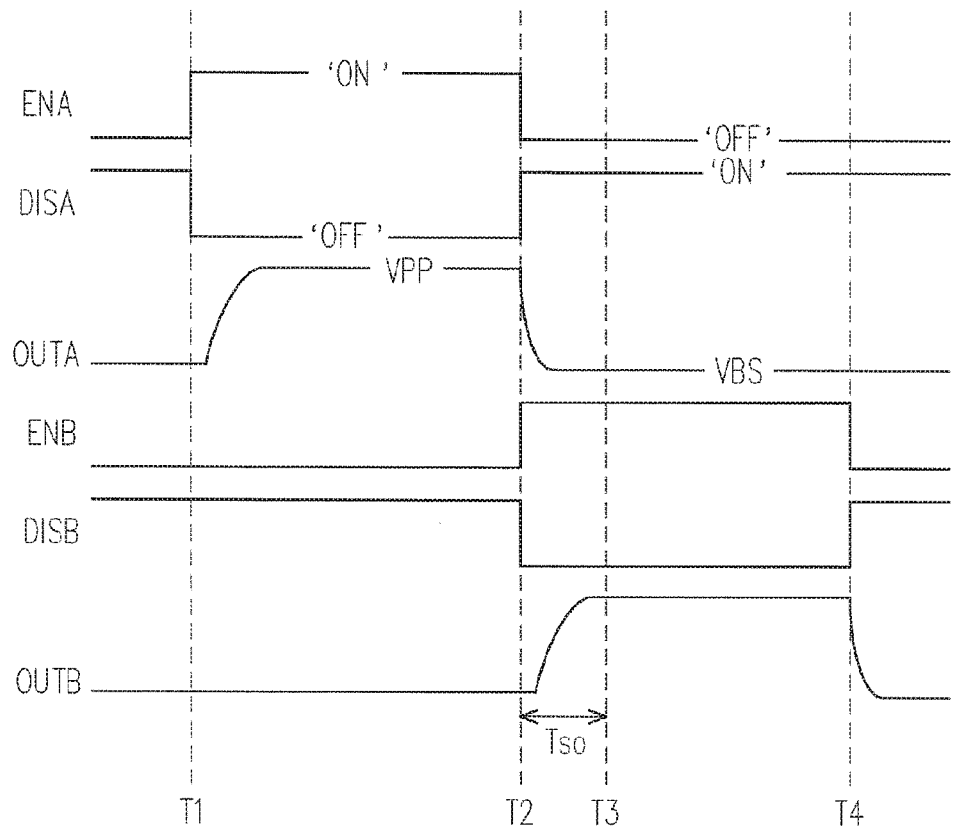
FIG. 2 and FIG. 3 are schematic diagrams showing conventional methods for controlling a decode switch.
Figure 3:
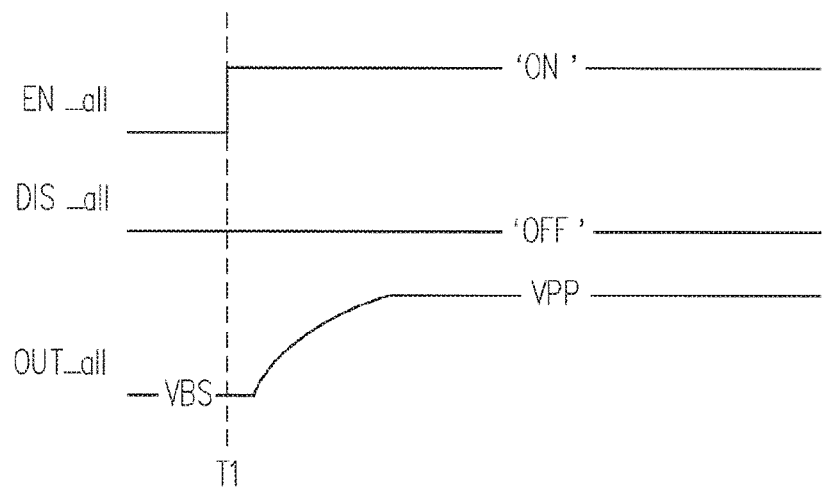

During the time period Tsw between the time moments T2 and T3, the capacitance CL1 helps charging the capacitance CL2. In this case, some electric charges of the capacitance CL1 may be transferred to the capacitance CL2 for charging the capacitance CL2, and not all of the electric charges of the capacitance CL1 are dissipated into the ground. This charge sharing between the capacitances can save electric power and improve the setup speed of the target decode path. For example, the setup time Tsi of the target decode path 122 in FIG. 4 can be shorter than the setup time Tso of the target decode path 122 in FIG. 2.

The invention is not limited to switching the assertion from the output terminal OUTA to the output terminal OUTB. In another embodiment of the invention, the assertion may be switched from any one of the decode paths 121-21n to another decode path 121-12n.

In another embodiment of the invention, the setup time of the target decode path can be further shortened by pre-charging one or more of the capacitances of the other decode paths. For example, a plurality of the capacitances CL1 and CL3~CLn may be charged by the power source 110 to the preset voltage VPP. Next, the switch ENB may be turned on and the switch DISB may be turned off. In this way, those pre-charged capacitances among CL1 and CL3~CLn can help the power source 110 to charge the capacitance CL2 to shorten the setup time of the decode path 122.

The sharing voltage above may be expressed as VBS+(CLC/(CLC+CLT))*(VPP−VBS). CLC is the combined capacitance of the one or more pre-charged capacitance. CLT is the capacitance of the target capacitance. In other words, the sharing voltage is determined by the preset voltage VPP and the electric equilibrium between the at least one pre-charged capacitance and the target capacitance. The sharing voltage is directly proportional to the preset voltage VPP. The sharing voltage is directly proportional to the combined capacitance CLC of the at least one pre-charged capacitance. The sharing voltage is inversely proportional to the sum of the combined capacitance CLC and the capacitance CLT of the target capacitance.

In the embodiment corresponding to FIG. 4, there is only one pre-charged capacitance (CL1) and the target capacitance is CL2. The capacitance of CL1 is equal to the capacitance of CL2. Therefore the sharing voltage is about ½ VPP, which means a half of the electric charges of the capacitance CL1 is saved and a half of the electric power provided by the power source 110 is saved.

Figure 5:
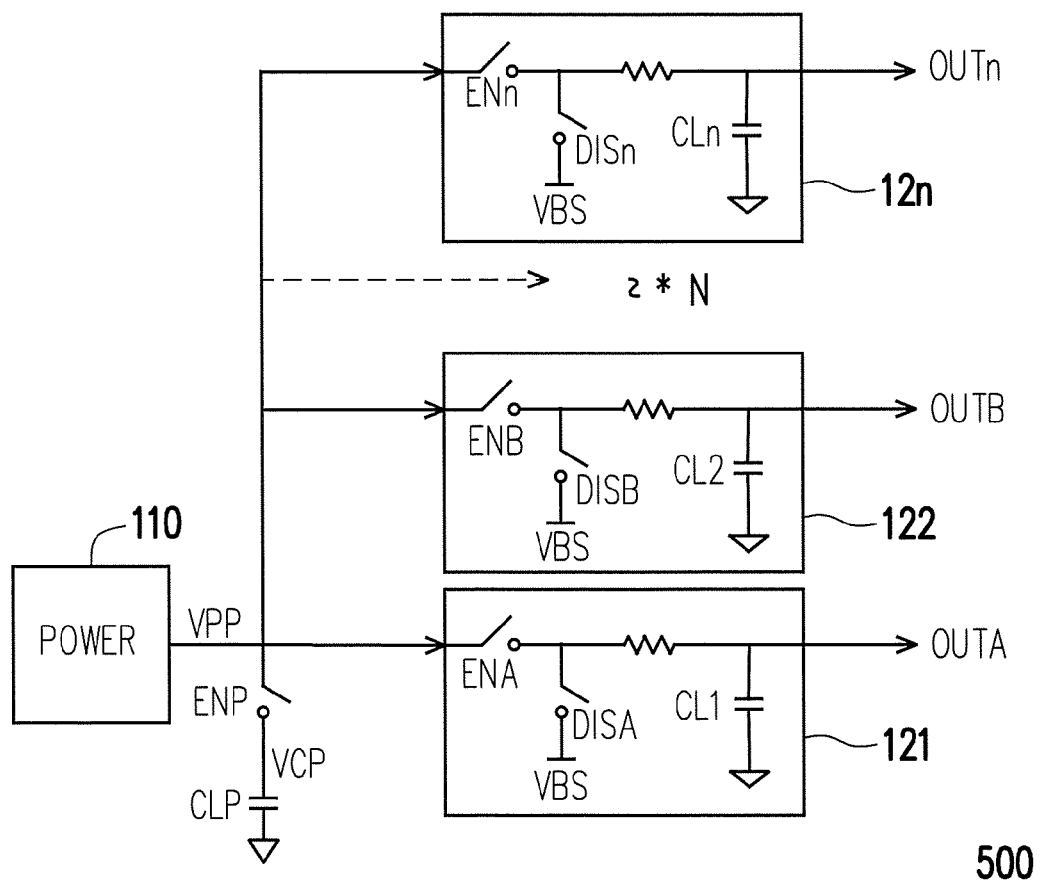
FIG. 5 is a schematic diagram showing a decode switch according to an embodiment of the invention.

FIG. 5 is a schematic diagram showing a decode switch 500 according to an embodiment of the invention. The decode switch 500 includes a power source 110 providing the preset voltage VPP and n decode paths 121-12n coupled to the power source 110. n is a preset integer larger than one. Each decode path 121-12n includes a capacitance CL1-CLn coupled to the power source 110.

The difference between the decode switch 500 and the decode switch 100 is the addition of the switch ENP and the capacitance CLP. The capacitance CLP is not included in any one of the decode paths 121-12n. The capacitance CLP may be used to shorten the setup time of any one of the decode paths 121-12n by charge sharing.

Figure 6:
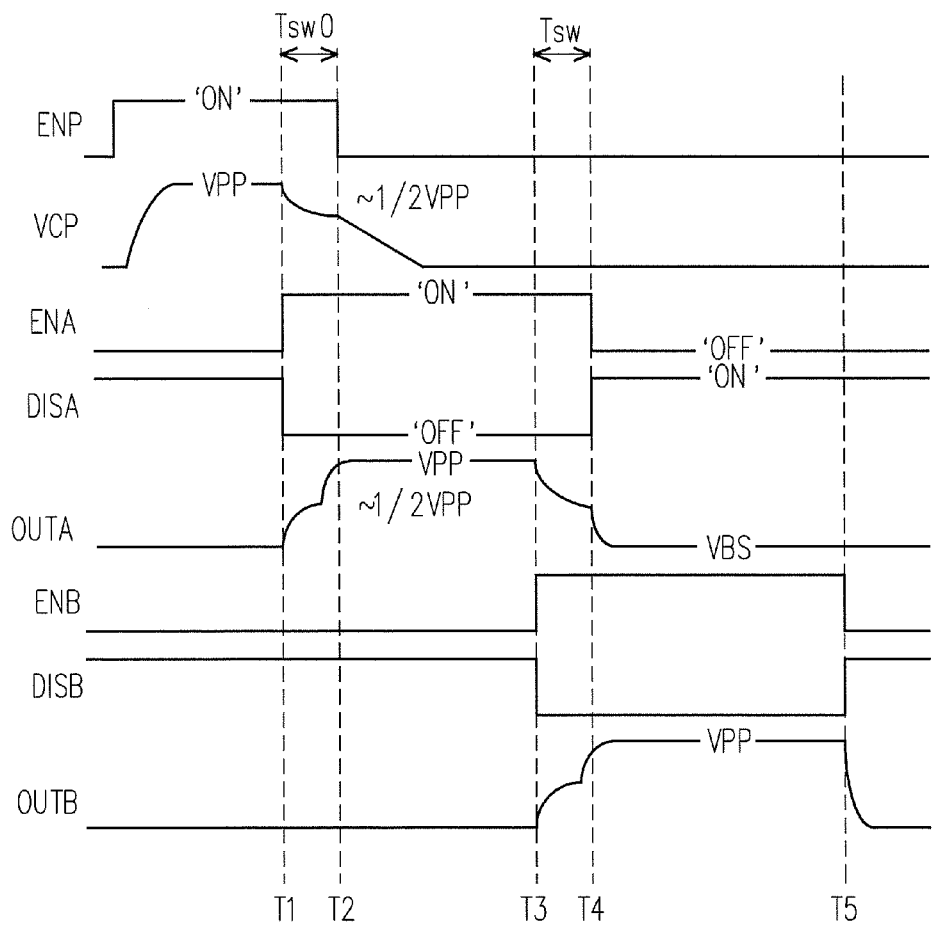
FIG. 6 is a schematic diagram showing a method for controlling a decode switch according to an embodiment of the invention.

For example, FIG. 6 is a schematic diagram showing a method for controlling the decode switch 500 to switch the assertion to the decode paths 121 and 122 according to an embodiment of the invention. The capacitances of the capacitances CLP, CL1 and CL2 are equal in this embodiment.

At first, the switch ENP is turned on, thus connecting the capacitance CLP to the power source 110 through the switch ENP. The power source 110 charges the capacitance CLP so that the voltage VCP of the capacitance CLP rises from the reference voltage VBS to the preset voltage VPP.

At the time moment T1, the switch ENA is turned on and the switch DISA is turned off, thus connecting the capacitances CLP and CL1 through the switches ENP and ENA. The capacitance CLP begins charging the capacitance CL1. Therefore, the voltage VCP drops from the preset voltage VPP and the voltage of the output terminal OUTA rises from the reference voltage VBS. At the time moment T2, both of the voltage VCP and the voltage of the output terminal OUTA reach the sharing voltage, which is approximately ½ VPP. The charge sharing between CLP and CL1 helps to shorten the setup time Tsw0 of the decode path 121.

The following switching from the output terminal OUTA to the output terminal OUTB is already depicted and described in the embodiment corresponding to FIG. 4. Therefore, the details are not repeated here.

The sharing voltage between the capacitances CLP and CL1 may be expressed as VBS+(CLP/(CLP+CL1))*(VPP−VBS). In other words, the sharing voltage is determined by the preset voltage VPP and the electric equilibrium between the capacitances CLP and CL1.

Figure 7:
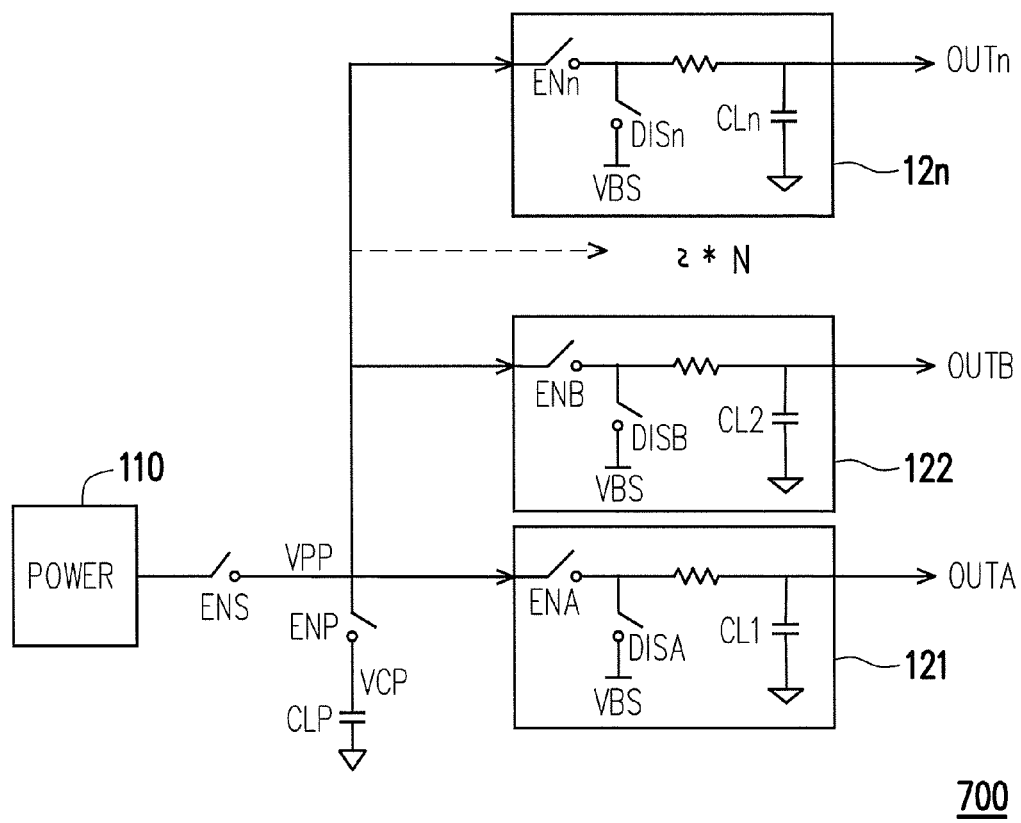
FIG. 7 is a schematic diagram showing a decode switch according to an embodiment of the invention.

FIG. 7 is a schematic diagram showing a decode switch 700 according to an embodiment of the invention. The decode switch 700 is similar to the decode switch 500. The difference is the addition of the switch ENS coupled between the power source 110 and the decode paths 121-12n. The switch ENS may be turned on to connect the power source 110 to the decode paths 121-12n so that the power source 110 can charge one or more of the capacitances CLP and CL1-CLn. The switch ENS may be turned off to disconnect the power source 110 from the capacitances CLP and CL1-CLn when one or more of the capacitances CLP and CL1-CLn is connected to another one of the capacitances CL1-CLn for charge sharing. Take FIG. 6 for example, the switch ENS may be turned on during the time period before T1, the time period between T2 and T3, and the time period after T4, while the switch ENS may be turned off during the time period between T1 and T2 and the time period between T3 and T4.

The addition of the switch ENS further reduces power consumption because, by turning off the switch ENS, the power source 110 does not supply power to the target capacitance before the voltage of the target capacitance reaches the sharing voltage.

In another embodiment of the invention, the switch ENS may be added into the decode switches 100 and 500 for disconnecting the power source 110 from the decode paths 121-12n.

In summary, the decode switches and the methods for controlling the decode switches provided by the previous embodiments can save electric power and improve the setup speed of the decode paths. The decode switches are applicable to power system, power switch, decode switch. The decode switches are also applicable to NOR and NAND type floating gate memory and charge trapping memory, non-volatile memory and embedded memory.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A decode switch, including:
a power source providing a first voltage;
at least one source capacitance coupled to the power source and an output terminal;
a target capacitance coupled to the power source, wherein the power source charges the source capacitance to the first voltage, the source capacitance is connected to the target capacitance and the source capacitance charges the target capacitance to a second voltage, and the power source charges the target capacitance from the second voltage to the first voltage; and
a control circuit, controlling a switch to disconnect the source capacitance from the target capacitance and connect the source capacitance to a reference voltage to discharge the source capacitance when the target capacitance is charged to the second voltage.

2. The decode switch of claim 1, wherein the decode switch includes a plurality of decode paths, each said source capacitance is included in a different one of the decode paths, and the target capacitance is included in another different one of the decode paths.

3. The decode switch of claim 1, wherein the decode switch includes a plurality of decode paths, one said source capacitance is not included in any one of the decode paths, and the target capacitance is included in one of the decode paths.

4. The decode switch of claim 1, wherein the power source is disconnected from the target capacitance when the source capacitance is connected to the target capacitance.

5. The decode switch of claim 1, wherein the second voltage is determined by the first voltage and electric equilibrium between the source capacitance and the target capacitance.

6. The decode switch of claim 1, wherein the second voltage is directly proportional to the first voltage, the second voltage is directly proportional to a combined capacitance of the source capacitances, and the second voltage is inversely proportional to a sum of the combined capacitance and a capacitance of the target capacitance.

7. A method for controlling a decode switch, including:
a power source of the decode switch charging at least one source capacitance of the decode switch to a first voltage;
connecting the source capacitance to a target capacitance of the decode switch and an output terminal;
the source capacitance charging the target capacitance to a second voltage;
the power source charging the target capacitance from the second voltage to the first voltage; and
disconnecting the source capacitance from the target capacitance and connecting the source capacitance to a reference voltage to discharge the source capacitance when the target capacitance is charged to the second voltage.

8. The method of claim 7, wherein the decode switch includes a plurality of decode paths, each said source capacitance is included in a different one of the decode paths, and the target capacitance is included in another different one of the decode paths.

9. The method of claim 7, wherein the decode switch includes a plurality of decode paths, one said source capacitance is not included in any one of the decode paths, and the target capacitance is included in one of the decode paths.

10. The method of claim 7, further including:
disconnecting the power source from the target capacitance when the source capacitance is connected to the target capacitance.

11. The method of claim 7, wherein the second voltage is determined by the first voltage and electric equilibrium between the source capacitance and the target capacitance.

12. The method of claim 7, wherein the second voltage is directly proportional to the first voltage, the second voltage is directly proportional to a combined capacitance of the source capacitances, and the second voltage is inversely proportional to a sum of the combined capacitance and a capacitance of the target capacitance.

* * * * *